United States Patent
Buckland et al.

(12) 
(10) Patent No.: US 6,541,995 B1
(45) Date of Patent: Apr. 1, 2003

(54) CIRCUIT AND METHOD FOR DRIVING SIGNALS TO A RECEIVER WITH TERMINATORS

(75) Inventors: Patrick Allen Buckland, Austin, TX (US); Philip Michael Corcoran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/956,769

(22) Filed: Sep. 20, 2001

(51) Int. Cl.[7] .................... H03K 17/16; H03K 19/0175
(52) U.S. Cl. ............................. 326/21; 326/82; 326/86; 710/106; 710/105
(58) Field of Search ..................... 326/21, 30, 56, 326/57, 82, 86, 90; 710/106, 105, 65

(56) References Cited

U.S. PATENT DOCUMENTS

| | | | | |
|---|---|---|---|---|
| 5,880,599 A | * | 3/1999 | Bruno | 326/56 |
| 5,978,877 A | * | 11/1999 | Strevey | 710/128 |
| 5,987,558 A | * | 11/1999 | Monia et al. | 710/240 |
| 6,034,551 A | * | 3/2000 | Bridgewater, Jr. | 326/82 |
| 6,243,776 B1 | * | 6/2001 | Lattimore et al. | 710/104 |

* cited by examiner

*Primary Examiner*—Daniel Chang
(74) *Attorney, Agent, or Firm*—Duke W. Yee; Mark E. McBurney; Michael R. Nichols

(57) ABSTRACT

The present invention includes a driving circuit and method for driving signals. An input signal is received by the driving circuit on an input signal line which is connected to a bias circuit for a common voltage level. Two output lines from the driving circuit are driven to the receiver which is capable of using differential output lines or a selected single ended output line. Furthermore, the output lines may be driven to a high impedance selected by the voltage level of the input signal. The receiver of the output lines may be a SCSI device using multimode terminators which include low voltage differential and a single ended mode.

20 Claims, 1 Drawing Sheet

CIRCUIT AND METHOD FOR DRIVING SIGNALS TO A RECEIVER WITH TERMINATORS

BACKGROUND OF THE INVENTION

1. Technical Field

The present invention relates generally to a driving circuit to drive a transistor-transistor logic (TTL) level signal on to multimode receiver with terminators as differential or single ended signals. Particularly, the circuit is used to drive a reset line to a small computer system interface (SCSI) in either single ended (SE) or low-voltage differential (LVD) mode.

2. Description of Related Art

Two types of interfaces are typically present in a computer system: single ended or differential lines. The single ended transmits a bit onto a single line or wire. A positively active signal is considered "active" when the voltage level is positive and "inactive" when the voltage level is zero or negative. On the other hand, a negatively active signal is considered "active" when the voltage level is low or zero or negative and "inactive" when the voltage level is high or positive. When lines are configured according to differential lines, two wires or lines having voltage differentiation are used. A differential output circuit has first and second output lines.

A line driver improves output current or administers a conversion of a single ended line into a pair of differential lines or vice versa. Differential lines provide better noise immunity than a single-ended line. Differential lines are typically used when driving long line lengths in electrically noisy environments. A disadvantage of using a differential-mode is that it requires twice as many signal lines as a single-ended line. For this reason, a device may have different interfaces.

Small computer system interface (SCSI) devices have three different interface protocols: single-ended (SE); low-voltage differential (LVD); or high-voltage differential (HVD). Each of the interface lines, control and data lines, should be terminated properly at both ends to avoid reflections and to maintain the integrity of the signals. Consequently, SE lines are terminated differently than HVD lines (SCSI, SCSI-2, and SCSI-3 devices) and LVD lines (Ultra SCSI-2 devices). For further details of SCSI terminations, please refer to component UCC5628 Multimode SCSI 14 Line Terminator made by Unitrode. Consequently, a wide variety of different SCSI devices exists in the industry today.

Previous circuit design requires two separate complicated drivers, one for LVD mode termination and another for SE mode termination. A human operator must select between the drivers. Unfortunately, once selected, if the SCSI device is replaced with another, the operator must again select between the drivers according to the new device being connected.

Therefore it would be advantageous to have an improved circuit and method for reducing the complexity of drivers for LVD mode termination and SE mode termination without the driver having to detect either mode.

SUMMARY OF THE INVENTION

The present invention includes a driving circuit and method for driving signals. An input signal is received by the driving circuit on an input signal line which is connected to a bias circuit for a common voltage level. Two output lines from the driving circuit are driven to the receiver which is capable of using differential output lines or a selected single ended output line. Furthermore, the output lines may be driven to a high impedance selected by the voltage level of the input signal. The receiver of the output lines may be a SCSI device using multimode terminators which include low voltage differential and a single ended mode.

Particularly, the present invention includes a first switch which generates a voltage level coupled to a second switch that drives a signal onto the first output line, and a third switch that drives another signal onto the second output line. The first and third switches are controlled by voltage level of the input signal. The second switch is controlled by the voltage level generated by the first switch. The voltage level generated by the first switch is connected to a bias circuit for voltage reference.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
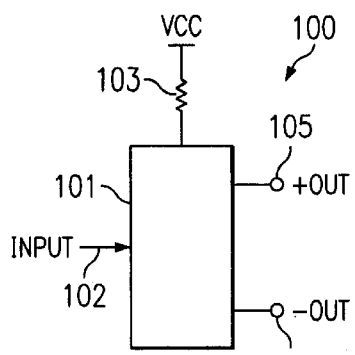
FIG. 1 is a general pictorial representation of a driving circuit in accordance with a preferred embodiment of the present invention.

With reference now to the figures, FIG. 1 generally depicts a pictorial representation of a driving circuit capable of driving differential pair outputs or a single end output in accordance with the present invention. A driving circuit 100 contains a driver output circuit 101 with which the circuit receives a logical level input 102 from a central processing unit, bus master device, or the like and generates two output lines 104 and 105 that may be provided to a SCSI bus. The outputs can drive either in a low voltage differential or logical level single ended mode. Input 102 may select output lines 104 and 105 to be in a high impedance mode. Input 102 is also connected to a pull up resistor for voltage reference bias circuit 103 and is provided from a central processing unit, bus master device, or the like.

Figure 2:
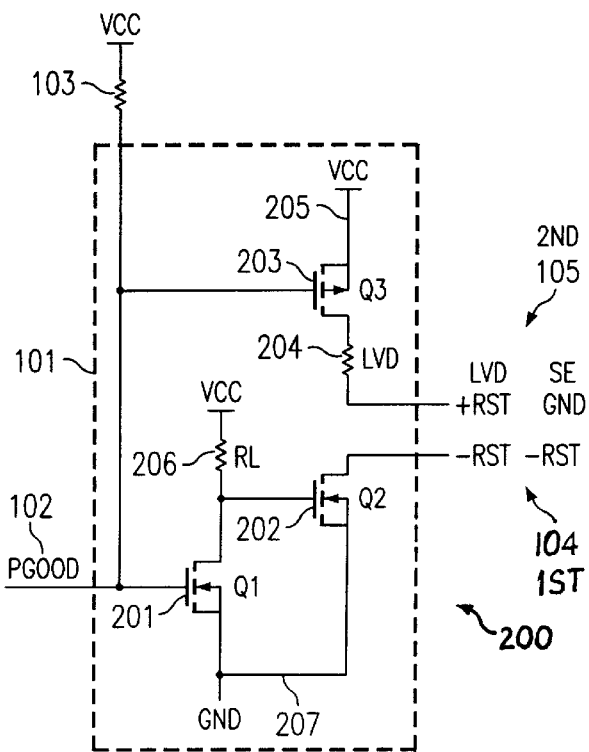
FIG. 2 shows a circuitry of a preferred driving output circuit in accordance with a preferred embodiment of the present invention.

In accordance with a preferred embodiment of the present invention, FIG. 2 is a detailed view of driver output circuit 101 and illustrates a preferred mode of operation. Driver output circuit 101 contains three switches 201, 202, and 203 and load resistor 204 for second output line 105. Those skilled in the art will understand that switches 201, 202, and 203 may be built using different types of transistors such as bipolar, NFET, and PFET transistors.

In a preferred mode, logical level input 102 is a positive power good (PGOOD) signal which determines the state of first output line 104 and second output line 105. Low level input 102 indicating no or low voltage level would trigger a reset signal to a receiver operating in either in differential or single ended mode. On the other hand, a high level would force output lines 104 and 105 to a high impedance state or tri-state condition when power indicated by a high voltage level is present for the system.

Below, Table 1 refers to FIGS. 2, 4, and 5. Table 1 illustrates the states of each of the switches (201, 202, and 203) and corresponding outputs (104 and 105) with a receiver operatin in either LVD or SE mode.

TABLE 1

States of each of the switches and outputs

| | Driving Output Circuit | | | | | Receiver | | | |
|---|---|---|---|---|---|---|---|---|---|
| Input | Switches | | | Output | | LVD Mode | | SE Mode | |
| pgood | Q1 | Q2 | Q3 | 1st | 2nd | −RST | +RST | −RST | +RST |
| HIGH | ON | OFF | OFF | Z | Z | ~1.3 V | ~1.1 V | ~2.7 V | GND |
| LOW | OFF | ON | ON | LIVE | LIVE | <0.4 V | >1.3 V | <0.4 V | GND |

According to the function of a transistor as a switch, a high logic at the gate of a transistor turns on the transistor causing it to conduct electricity; a low logic at the gate switches it off. However, for an inverted transistor, a low logic turns the device on, and high logic turns it off. Specifically, during a power good cycle when a system has good operating voltage level, a high logic input 102 turns on first switch 201 at the gate. The drain of first switch 201 is connected to the gate of second switch 202 and pull up biasing circuit 206. First switch 201 is also connected to ground at the source. When first switch 201 is turned on, second switch 202 is turned off because a logic level is low at its gate. As a result, first output line 104 is placed at high impedance. Third switch 203 also is turned off because this switch is an inverted transistor. A high logic input 102 turns off third switch 203. Thus, second output line 105 also goes into high impedance state.

When the power is not present indicating that the system is not receiving a good operating voltage level, the logic low input 102 turns off first switch 201 and turns on third switch 203. With first switch 201 off, a high logic level at the gate of second switch 202 through pull up biasing circuit 206 such that second switch 202 is switched on. Because second switch 202 and third switch 203 are turned on, output lines 104 and 105 are no longer in a high impedance state and may drive signals to a receiver operating in either differential or single ended mode. Furthermore, a receiver may select either output lines 104 or 105 as its input. A differential receiver utilizes both output lines 104 and 105. A single ended receiver may utilize either output line 104 or output line 105. More importantly, driver output circuit 101 drives output lines 104 and 105 independently of the type of receiver and does not have to detect whether the receiver is operating in differential or single ended mode.

Figure 3:
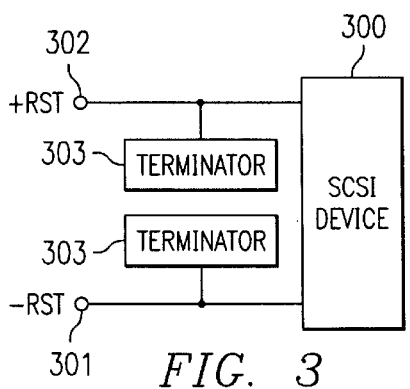
FIG. 3 shows a SCSI device receiving reset lines having multiple termination mode in accordance with a preferred embodiment of the present invention.

Referring now to FIG. 3, driving circuit 100 drives output lines 104 and 105 for input to a preferred receiver, such as a SCSI device 300 that has a multimode bus which can be either low voltage differential (LVD) or single ended (SE) mode. An example of a device which may be used to terminate SCSI device 300 is a UCC5628 Multimode SCSI Terminator made by and commercially available from Unitrode. Specifically, output lines 104 and 105 are connected to the SCSI device 300 reset signals, −RST signal 301 and +RST signal 302, respectively. First output line 104 is connected to the −RST signal 301, and second output line 105 is connected to +RST signal 302. The reset signals are also connected to terminator(s) 303 which determines the mode of operation (SE and LVD). Driving circuit 100 operates in either mode without having to determine which mode the SCSI line is operating in. Devices using either mode can operate the single set of driver output circuit 101 of the present invention. SCSI line terminators 303 define which mode the receiver is functioning under.

Figure 4:
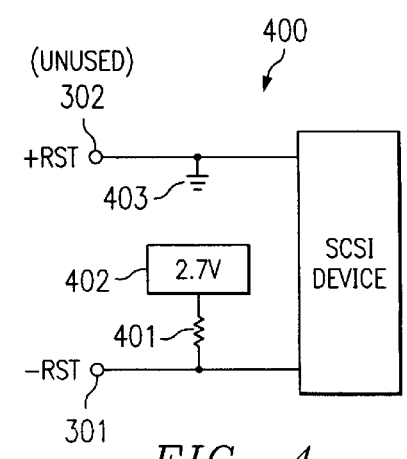
FIG. 4 is a pictorial representation of a SCSI SE mode line terminator.

Turning now to FIG. 4, a SCSI SE mode terminator is depicted in accordance with the present invention. In this example, an SE mode terminator has a 55 Ohm terminating resistor 401 connected to 2.7V terminating voltage regulator 402. In SE mode, −RST signal 301 is a TTL level signal and requires a 48 ma driver to drive it low. When the PGOOD signal is high, first output line 104 is in high impedance mode. The SE termination will pull −RST signal 301 to a high level for a non-reset condition. On the other hand, if PGOOD signal is at a logical low level, −RST signal 301 is grounded for a reset condition. Note that +RST signal 302 is always tied to ground 403 by a terminator 303 and is not utilized in an SE mode. For this reason, the current limiting resistor RL 204 allows third switch 203 to be turned on when the termination is in SE mode without damaging third switch 203.

Figure 5:
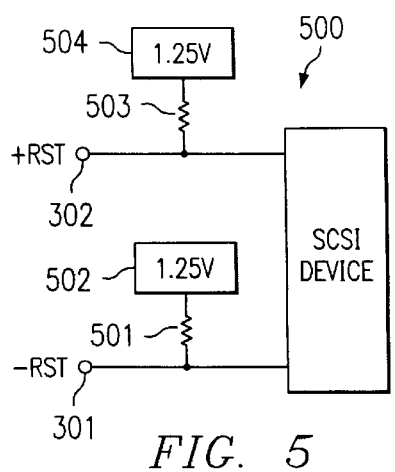
FIG. 5 is a pictorial representation of a SCSI LVD mode line terminator.

Turning now to FIG. 5, a SCSI LVD mode terminator is depicted in accordance with the present invention. In the LVD mode −RST signal 301 and +RST signal 302 operate as a differential pair rather than using TTL levels. +RST signal 302 must be driven to a higher voltage than −RST signal 301 to cause an active reset to occur. In LVD mode, the terminators include a pull-up −RST signal 301 using terminating resistor 501 and 1.25V terminating voltage regulator 502 plus a 0.062V positive voltage offset. The +RST signal is terminated with terminating resistor 503 and 1.25V terminating voltage regulator 504 plus a 0.062V negative voltage offset.

When input 102 is high, first switch 201 is turned on, second and third switches 202 and 203 are turned off, and output lines 104 and 105 are in high impedance condition. In LVD mode, the voltage of −RST signal 301 is regulated by the terminator to remain around 1.3 volts, and the voltage of +RST signal 302 is regulated to around 1.2 volts when input line 102 is high. Because −RST signal 301 has a higher voltage than +RST signal 302, reset is inactive for the SCSI device.

However, when input 102 is low, first switch 201 is turned off, second switch 202 and third switch 203 are on, and output lines 104 and 105 drive signals to −RST signal 301 and +RST signal 302. In LVD mode, −RST signal 301 is driven to approximately GND or zero volt; +RST signal is driven to be greater than 1.3 volts. Because +RST signal 302 has a higher voltage than −RST signal 301, reset is active for the SCSI device.

The present invention is a method and circuit for configuring a signal line as either a single-ended mode line or as differential mode lines, depending on the SCSI device. The present invention is designed in such a way that no selection by an operator is required and additional lines are not required such that the same circuitry may be used for either single-ended mode or differential mode.

The description of the present invention has been presented for purposes of illustration and description, and is not intended to be exhaustive or limited to the invention in the form disclosed. Many modifications and variations will be apparent to those of ordinary skill in the art. For example, the voltage, current and impedance values used herein are merely illustrative. The described embodiment was chosen and described in order to best explain the principles of the invention, the practical application, and to enable others of ordinary skill in the art to understand the invention for various embodiments with various modifications as are suited to the particular use contemplated.

What is claimed is:

1. A driving circuit for providing at least one signal to a receiver device capable of operating in a plurality of signal processing modes, said circuit comprising:

a first output line;

a second output line;

an output driver coupled to said first output line and second output line, wherein said output driver drives a first signal onto said first output line and a second signal onto said second output line;

a receiver receiving at least one of said first signal and said second signal, wherein said receiver comprises one of a differential receiver and a single ended receiver such that said differential receiver receives said first signal and said second signal, and said single ended receiver receives one of said first signal and said second signal;

wherein said output driver detects neither said differential receiver nor said single ended receiver; and wherein said output driver includes:
   a first switch for providing a first switch output signal based upon an input signal, wherein said first switch couples with a first voltage reference from a first bias circuit;
   a second switch for driving said first signal onto said first output line wherein said second switch is controlled by said first switch output signal coupled to a second voltage reference from a second bias circuit; and
   a third switch for driving said second signal onto said second output line through a load resistor wherein said third switch is controlled by said input signal.

2. The driving circuit according to claim 1 wherein said first and second output lines have high impedance determined by a voltage level of an input.

3. The driving output circuit according to claim 1 wherein said first, second, and third switches are bipolar or field-effect transistors.

4. The driving output circuit according to claim 1 wherein said load resistor is current limiting and allows said third switch to switch on without being damaged.

5. The driving circuit according to claim 1 wherein said input signal is in transistor-transistor logic.

6. The driving circuit according to claim 1 wherein said receiver is a SCSI device having one or low voltage differential and single ended mode terminators.

7. The driving circuit according to claim 1 wherein said first output line and said second output line are differential output lines having a voltage difference.

8. The driving circuit according to claim 1 wherein said first output line and said second output line are in transistor-transistor logic.

9. The driving circuit according to claim 1 wherein said plurality of signal processing modes includes a single ended mode.

10. The driving circuit according to claim 1 wherein said plurality of signal processing modes includes a differential mode.

11. A method of providing at least one signal, from a driving circuit to a receiver device which is capable of operating in a plurality of signal processing modes, said method comprising the step of:

switching a first switch for generating a first switch output signal wherein said first switch is controlled by an input signal coupled to a voltage reference from a first bias circuit;

switching a second switch for driving a first output signal onto a first output line wherein said second switch is controlled by said first switch output signal coupled to a second voltage reference from a second bias circuit; and switching a third switch for driving a second output signal onto a second output line through a load resistor wherein said third switch is controlled by said input signal.

12. The method according to claim 11 wherein said first and second output lines have high impedance determined by a voltage level of the input signal.

13. The method according to claim 11 wherein said receiver device is a SCSI device having one of low voltage differential and single ended mode terminators.

14. The method according to claim 11 wherein said input signal is in transistor-transistor logic.

15. The method according to claim 11 wherein said first output line and said second output line are differential output lines having a voltage difference.

16. The method according to claim 11 wherein said first output line and said second output line are in transistor-transistor logic.

17. The method according to claim 11 wherein said plurality of signal processing modes includes a single ended mode.

18. The method according to claim 11 wherein said plurality of signal processing modes includes a differential mode.

19. The method according to claim 11 wherein said first, second, and third switches are bipolar or field-effect transistors.

20. The method according to claim 11 wherein said load resistor is current limiting and allows said third switch to switch on without being damaged.

* * * * *